(12) United States Patent
Wrosch et al.

(10) Patent No.: US 10,903,380 B1
(45) Date of Patent: Jan. 26, 2021

(54) ASSEMBLY AND MOUNTING OF SOLAR CELLS ON AIRFOILS

(71) Applicant: Vanguard Space Technologies, Inc., San Diego, CA (US)

(72) Inventors: Matthew Wrosch, San Diego, CA (US); Eric McNaul, Boulder, CO (US); Theodore Stern, El Cajon, CA (US); Fadel Hernandez, La Mesa, CA (US)

(73) Assignee: Vanguard Space Technologies, Inc., Albuqerque, NM (US)

( * ) Notice: Subject to any disclaimer, the term of this patent is extended or adjusted under 35 U.S.C. 154(b) by 435 days.

(21) Appl. No.: 15/977,634

(22) Filed: May 11, 2018

Related U.S. Application Data

(62) Division of application No. 15/359,814, filed on Nov. 23, 2016, now Pat. No. 10,026,857.

(51) Int. Cl.
| | |
|---|---|
| *H01L 31/0392* | (2006.01) |
| *H02S 10/40* | (2014.01) |
| *H01L 31/0725* | (2012.01) |
| *H01L 31/0304* | (2006.01) |
| *H01L 31/18* | (2006.01) |
| *B60K 16/00* | (2020.01) |

(52) U.S. Cl.
CPC .... *H01L 31/03926* (2013.01); *H01L 31/0304* (2013.01); *H01L 31/0725* (2013.01); *H01L 31/1876* (2013.01); *H02S 10/40* (2014.12); *B60K 2016/003* (2013.01); *B63B 2209/18* (2013.01); *B64D 2211/00* (2013.01)

(58) Field of Classification Search
CPC ............ B60K 2016/003; B64D 229/00; H01L 31/03926; H01L 31/1876; H02S 10/40; H02S 20/00; B63B 2209/18

USPC ..................................................... 244/123.1
See application file for complete search history.

(56) References Cited

U.S. PATENT DOCUMENTS

| 8,703,521 B2* | 4/2014 | Bedell .................. H01L 31/076 438/74 |
|---|---|---|
| 9,865,752 B2* | 1/2018 | Ikenaga ................ C08F 210/16 |
| 10,026,857 B1* | 7/2018 | Wrosch ............... H01L 31/0481 |
| 10,381,499 B1* | 8/2019 | Yang .................... H01L 31/0516 |
| 10,468,545 B1* | 11/2019 | Yang ......................... B64C 3/48 |
| 10,629,757 B2* | 4/2020 | Kruse ................. H01L 31/1804 |

(Continued)

FOREIGN PATENT DOCUMENTS

WO        2013187236 A1        12/2013

OTHER PUBLICATIONS

European Search Report for EP Patent Application No. 18182315.4, dated Feb. 12, 2019, 7 pages.

(Continued)

*Primary Examiner* — Christopher P Ellis

(57) ABSTRACT

A method of fabricating an airfoil, and the airfoil or airfoil skin so fabricated, including a solar cell array arranged on the surface of the airfoil by providing and utilizing an assembly fixture having a smooth, concave surface. An uncured supporting film composed of a composite material (such as a carbon fiber composite) is mounted directly on the back side of the solar cells; and the film of composite material is co-cured on the assembly fixture so that the array of interconnected solar cells is bonded to the supporting film. The bonded and cured film of composite material and an array of interconnected solar cells is then removed from the assembly fixture.

9 Claims, 8 Drawing Sheets

(56) References Cited

U.S. PATENT DOCUMENTS

| | | | | |
|---|---|---|---|---|
| 2008/0150289 | A1* | 6/2008 | Fein | B60L 53/52 |
| | | | | 290/55 |
| 2009/0078311 | A1* | 3/2009 | Stan | H01L 31/076 |
| | | | | 136/255 |
| 2009/0301544 | A1* | 12/2009 | Minelli | H01L 31/02008 |
| | | | | 136/244 |
| 2012/0048353 | A1* | 3/2012 | Woo | H01L 31/0481 |
| | | | | 136/251 |
| 2012/0067423 | A1* | 3/2012 | Lochtefeld | H01L 31/1896 |
| | | | | 136/261 |
| 2012/0160299 | A1* | 6/2012 | Reid | B32B 27/281 |
| | | | | 136/246 |
| 2014/0166067 | A1* | 6/2014 | McGlynn | H01L 31/06875 |
| | | | | 136/244 |
| 2014/0174509 | A1* | 6/2014 | Bonekamp | B32B 27/32 |
| | | | | 136/251 |
| 2014/0338745 | A1* | 11/2014 | Yoshimine | B32B 17/10788 |
| | | | | 136/256 |
| 2015/0203707 | A1* | 7/2015 | Klun | C07F 7/1804 |
| | | | | 428/412 |
| 2015/0357501 | A1* | 12/2015 | Derkacs | H01L 31/03046 |
| | | | | 136/255 |
| 2015/0364631 | A1* | 12/2015 | Aiken | H01L 31/022425 |
| | | | | 136/251 |
| 2016/0009068 | A1* | 1/2016 | Garner | B32B 17/064 |
| | | | | 156/196 |
| 2016/0167764 | A1* | 6/2016 | Grip | B64C 3/182 |
| | | | | 244/123.4 |
| 2016/0194072 | A1* | 7/2016 | Cornew | H01L 31/0216 |
| | | | | 136/244 |
| 2017/0012160 | A1* | 1/2017 | Clevenger | H01L 31/048 |
| 2017/0012163 | A1 | 1/2017 | Clevenger et al. | |
| 2017/0033247 | A1* | 2/2017 | Sarabandi | H01L 31/022425 |
| 2017/0222079 | A1* | 8/2017 | Li | C09J 7/50 |
| 2018/0108794 | A1* | 4/2018 | Aiken | H01L 31/0508 |
| 2020/0176622 | A1* | 6/2020 | Kim | H02S 30/20 |

OTHER PUBLICATIONS

Official Communication from the European Patent Office dated Aug. 14, 2020 for European Patent Application No. 18182315.4, 5 pages.

* cited by examiner

ASSEMBLY AND MOUNTING OF SOLAR CELLS ON AIRFOILS

REFERENCE TO RELATED APPLICATIONS

This application is a divisional of co-pending U.S. patent application Ser. No. 15/359,814 filed Nov. 23, 2016, which is incorporated herein by reference in its entirety.

BACKGROUND OF THE DISCLOSURE

1. Field of the Disclosure

The present disclosure relates to the field of airfoils, and photovoltaic solar arrays mounted on such airfoils, and more particularly to fabrication processes utilizing, for example, multijunction solar cells based on III-V semiconductor compounds mounted on a flexible film and adhered to the airfoil structure.

2. Description of the Related Art

Solar power from photovoltaic cells, also called solar cells, has been predominantly provided by silicon semiconductor technology. In the past several years, however, high-volume manufacturing of III-V compound semiconductor multijunction solar cells for space applications has accelerated the development of such technology not only for use in space but also for terrestrial solar power applications. Compared to silicon, III-V compound semiconductor multijunction devices have greater energy conversion efficiencies and generally more radiation resistance, although they tend to be more complex to manufacture. Typical commercial III-V compound semiconductor multijunction solar cells have energy efficiencies that exceed 27% under one sun, air mass 0 (AM0), illumination, whereas even the most efficient silicon technologies generally reach only about 18% efficiency under comparable conditions. The higher conversion efficiency of III-V compound semiconductor solar cells compared to silicon solar cells is in part based on the ability to achieve spectral splitting of the incident radiation through the use of a plurality of photovoltaic regions with different band gap energies, and accumulating the current from each of the regions.

Solar panels are generally formed by combining a large number of solar cells in an array. Individual solar cells, frequently with a rectangular or generally square-shape and sometimes with cropped corners, are connected in series to form a string of solar cells, whereby the number of solar cells used in the string determines the output voltage. Solar cells or strings of solar cells can also be interconnected in parallel, so as to increase the output current. In the field of aerospace applications, individual solar cells are provided with interconnects which are then combined to form an array. Conventionally, these large solar cells have been mounted on a support and interconnected using electrical interconnects.

There is a continuing need for improved methods of manufacturing and assembling photovoltaic solar arrays that can result in decreases in cost and/or increases in performance.

Accordingly, the present disclosure provides improved methods of manufacturing and assembling photovoltaic solar arrays on a surface that requires a highly smooth surface to achieve laminar flow such as an airfoil for an aircraft wing or other surface that can result in decreases in cost, greater compactness, and increases performance.

SUMMARY OF THE INVENTION

1. Objects of the Disclosure

It is an object of the present disclosure to provide a process for producing solar cell panels for aerospace applications.

It is another object of the present disclosure to provide an assembly tool for producing solar cell panels for aerospace applications.

It is another object of the disclosure to provide a method for making a solar cell panel with an extremely smooth outer surface.

It is another object of the disclosure to provide for an assembly fixture and method that facilitates assembly of at least certain steps of the process for manufacture of solar cell assemblies on the fixture.

Some implementations of the present disclosure may incorporate or implement fewer of the aspects and features noted in the foregoing objects.

2. Features of the Disclosure

All ranges of numerical parameters set forth in this disclosure are to be understood to encompass any and all subranges or "intermediate generalizations" subsumed therein. For example, a stated range of "1.0 to 2.0 microns" for a value of a dimension of a component such as its thickness should be considered to include any and all subranges beginning with a minimum value of 1.0 microns or more and ending with a maximum value of 2.0 microns or less, e.g., 1.0 to 1.2, or 1.3 to 1.4, or 1.5 to 1.9 microns.

Briefly, and in general terms, the present disclosure provides a method of fabricating a solar cell panel in a process by applying an adhesive film to a fixture of support, positioning a solar cell assembly over the adhesive film, applying pressure to adhere the assembly to the support; and removing the assembly from the fixture.

In one embodiment, the present disclosure provides method of fabricating an airfoil comprising: providing an assembly fixture having a smooth, concave surface; mounting a film composed of ethylene tetrafluoroethylene (ETFE) directly on the surface of the fixture; mounting a film composed of a non-crosslinked silicone pressure sensitive adhesive directly over the ETFE film; mounting an array of interconnected solar cells, each having a top (or light-facing) side, and a back side, directly over the adhesive film; mounting an uncured supporting film composed of a composite material directly on the back side of the solar cell array adjacent the adhesive film; co-curing the film of composite material so that the array of interconnected solar cells is bonded to the supporting film; and removing the bonded and cured film of the composite material and an array of interconnected solar cells with the ETFE film from the assembly fixture.

In another embodiment, the present disclosure provides a method of fabricating a solar cell array carrier comprising: providing a carbon composite face sheet; providing a double sided adhesive film and positioning it on the top surface of the face sheet; bonding the bottom surface of the adhesive film to the top surface of the face sheet by co-curing; sequentially positioning a sequence of solar cell assemblies over the top surface of the adhesive film; and sequentially bonding each of the sequence of solar cell assemblies to a predefined region on the top surface of the face sheet.

In some embodiments, a plurality of solar cells are disposed closely adjacent to one another on each of the strips by a distance between 5 and 25 microns.

In some embodiments, each of the solar cells have a dimension in the range of 0.5 to 10 mm on a side.

In some embodiments of the disclosure, the back side support is a polymide film layer such as KAPTON. KAPTON® is a trademark of E.I. du Pont de Nemours and Company. The chemical name for KAPTON® is poly (4, 4'-oxydiphenylene-pyromellitimide). Other polymide film sheets or layers may also be used.

In some embodiments, the support has a thickness of between 25 and 100 microns, or between 1 mil (25.4 μm) and 4 mil (101.6 μm).

In some embodiments, the film of composite material is composed of a poly (4, 4'-oxydiphenylene-pyromellitimide) material.

In some embodiments, there further comprises a foam supporting structure bonded to the film of the composite material.

In some embodiments, the array of interconnected solar cells are III-V compound semiconductor multijunction solar cells.

In some embodiments, the concave surface of the assembly fixture has a surface roughness of less than 0.001 inches rms.

In some embodiments, the concave surface of the assembly fixture forms an airfoil shaped surface.

In some embodiments, the pressure sensitive adhesive is a single monomer or co-monomer silicone blend.

In some embodiments, a double-faced pressure-sensitive adhesive template or patch is positioned on the backside of the solar cell assembly.

In some embodiments the support is a foam interior airfoil with a composite covering.

In some embodiments, the double-faced pressure-sensitive adhesive template or patch and the polyimide film are bonded together without use of a co-curing process.

In some embodiments, the double-faced pressure-sensitive adhesive template is covered at least partially with a release liner which is removed before making the bonding with the substrate.

In some embodiments, the PSA film may be an acrylic or a silicone adhesive, or any other suitable material.

In some embodiments, the PSA film may have one or two release liners, or possibly no release liners.

In some embodiments, the substrate may be a rigid substrate, such as an aluminum honeycomb substrate with carbon composite face sheet, or it may be a flexible substrate, such as a polymide film.

In some embodiments, the PSA film may also be applied to the back of the solar cells or solar cell assemblies.

In some embodiments, a pressure sensitive adhesive (PSA) film is prepared as a single layer.

In some embodiments, the PSA film may be prepared onto a permanent flexible substrate, such as a polyimide, with a release liner or liners on the opposite side.

In some embodiments, there may be a multiplicity of individual PSA patterns, each with its own front and back release liners. In some embodiments, there may be a multiplicity of individual PSA patterns, with one single, continuous release liner on one side and a multiplicity of release liners on the opposite side.

In some embodiments, there may be a multiplicity of individual PSA patterns with two continuous release layers covering the multiplicity of patterns on both sides.

In some embodiments, there may be a single, continuous film of PSA with release liners on one or both sides.

In some embodiments, the PSA film is used to bond solar cells or solar cell assemblies to a substrate.

In some embodiments, the PSA film may be applied first to the substrate, and then the solar cells attached to the PSA film, or it may be applied first to the back of the solar cells, and then the solar cells with PSA film are applied to the substrate.

In some embodiments, if the PSA film is prepared on a permanent substrate, the solar cells or solar cell assemblies may be applied directly to the PSA film.

In some embodiments, the PSA film may have continuous release liners that are removed in one step, or it may have a multiplicity of release liners that are removed individually.

In some embodiments, the PSA may be a silicone adhesive, an acrylic adhesive, or any other material that may be suitable for a PSA.

In some embodiments, the PSA may be a patterned layer, or it may be a continuous layer. For instance, the PSA may be patterned into the shape of solar cells.

In some embodiments, the assembly of polyimide-PSA-release liner is bonded directly to a solar panel substrate by co-curing the polyimide film to the face of the solar panel substrate. The solar panel substrate to which the polyimide is bonded may be composite substrate, and it may have a carbon composite face sheet. It may be a rigid substrate, or it may be a flexible substrate.

In some embodiments, following the above described assembly, the substrate is ready to have the solar cells or solar cell assemblies bonded to it. The release liner is removed when it is time to bond the solar cells, which exposes the PSA, and the solar cells are bonded to the PSA and the substrate. Since the PSA thickness is precisely controlled during manufacturing, the bondline is uniform and there is less opportunity to entrap air than when a liquid adhesive is used.

In another aspect, the present disclosure provides an aircraft and its method of fabrication comprising:

Some implementations of the present disclosure may incorporate or implement fewer of the aspects and features noted in the foregoing summaries.

Additional aspects, advantages, and novel features of the present disclosure will become apparent to those skilled in the art from this disclosure, including the following detailed description as well as by practice of the disclosure. While the disclosure is described below with reference to preferred embodiments, it should be understood that the disclosure is not limited thereto. Those of ordinary skill in the art having access to the teachings herein will recognize additional applications, modifications and embodiments in other fields, which are within the scope of the disclosure as disclosed and claimed herein and with respect to which the disclosure could be of utility.

BRIEF DESCRIPTION OF THE DRAWING

To complete the description and in order to provide for a better understanding of the disclosure, a set of drawings is provided. Said drawings form an integral part of the description and illustrate embodiments of the disclosure, which should not be interpreted as restricting the scope of the disclosure, but just as examples of how the disclosure can be carried out. The drawings comprise the following figures.

DESCRIPTION OF ILLUSTRATIVE EMBODIMENTS

Figure 1:
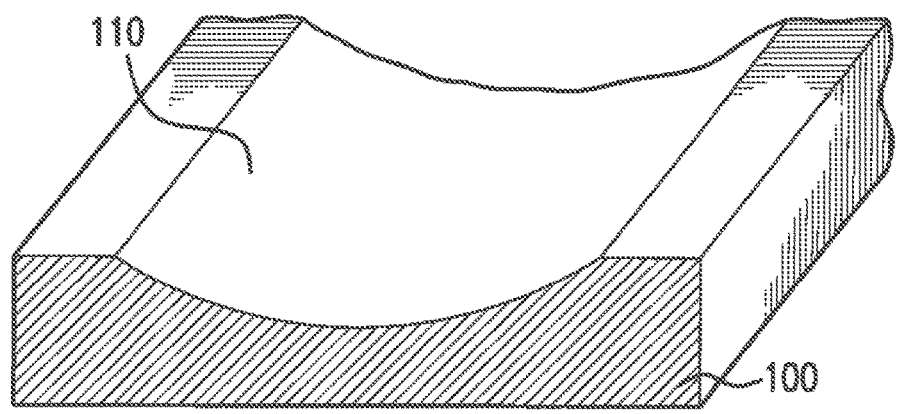
FIG. 1 is a perspective view of a fixture for assembling the airfoil or solar cell assembly according to the present disclosure.

Details of the present invention will now be described including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale.

FIG. 1 is a perspective view of a fixture 100 for assembling the airfoil according to the present disclosure. The operative surface 110 of the fixture is generally concave and in the shape of the solar cell assembly to be formed, which in one embodiment is a portion of an airfoil.

Figure 2:
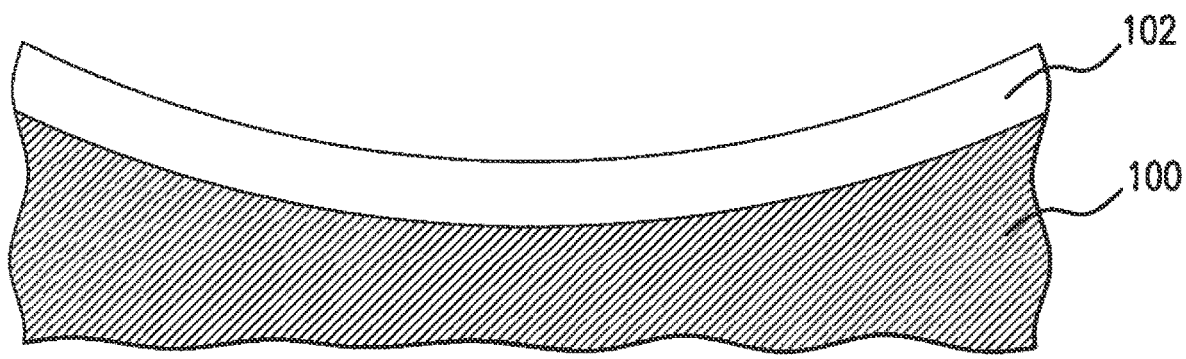
FIG. 2 is a cross-sectional view of the surface of the fixture of FIG. 1.

FIG. 2 is an enlarged cross-sectional view of the surface of the fixture of FIG. 1 after placement of an ethylene tetrafluoroethylene (EFTE) film 102 on the surface 110.

Figure 3:
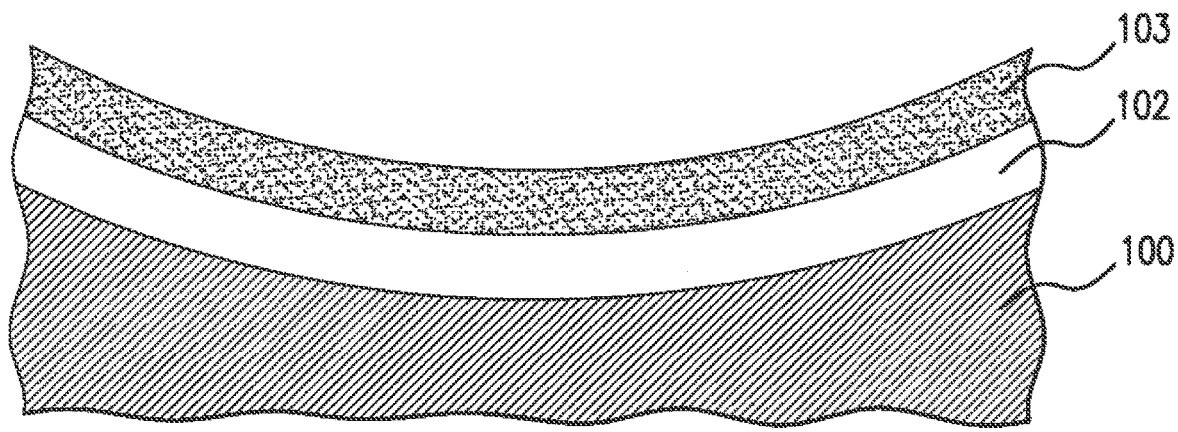
FIG. 3 is a cross-sectional view of the assembly of FIG. 2 after the next process step.

FIG. 3 is a cross-sectional view of the assembly of FIG. 2 after the next process step of mounting a film 103 composed of a non-crosslinked silicone pressure sensitive adhesive directly over the ETFE film 102.

In some embodiments, the pressure sensitive adhesive film is between 0.001 and 0.010 inches in thickness.

In some embodiments, the array of solar cells is between 0.010 and 0.030 inches in thickness.

Figure 4:
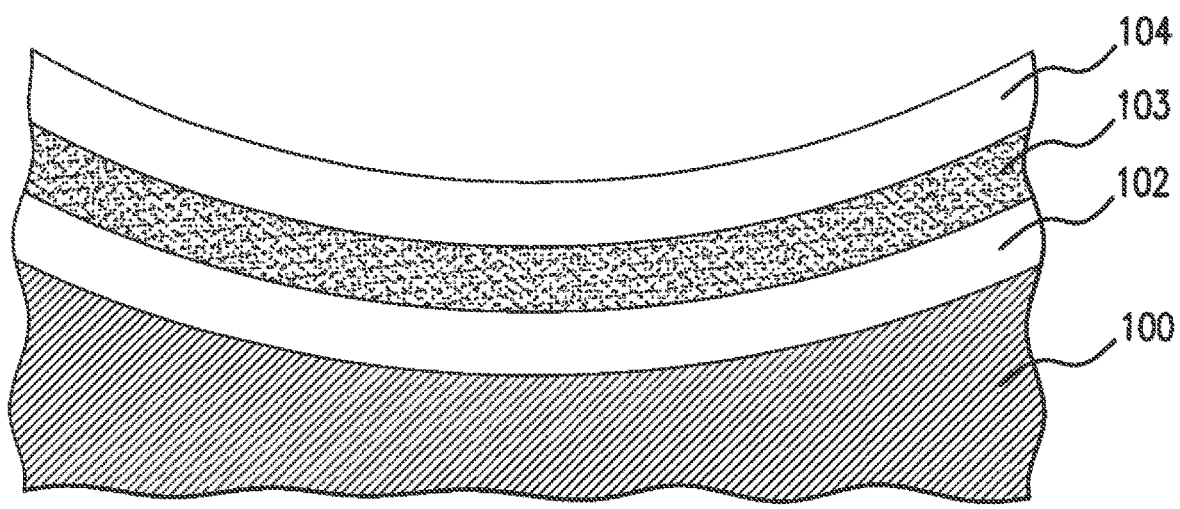
FIG. 4 is a cross-sectional view of the assembly of FIG. 2 after the next process step.

FIG. 4 is a cross-sectional view of the assembly of FIG. 3 after the next process step of mounting an array of interconnected solar cells 104 directly over the adhesive film 103.

Figure 5:
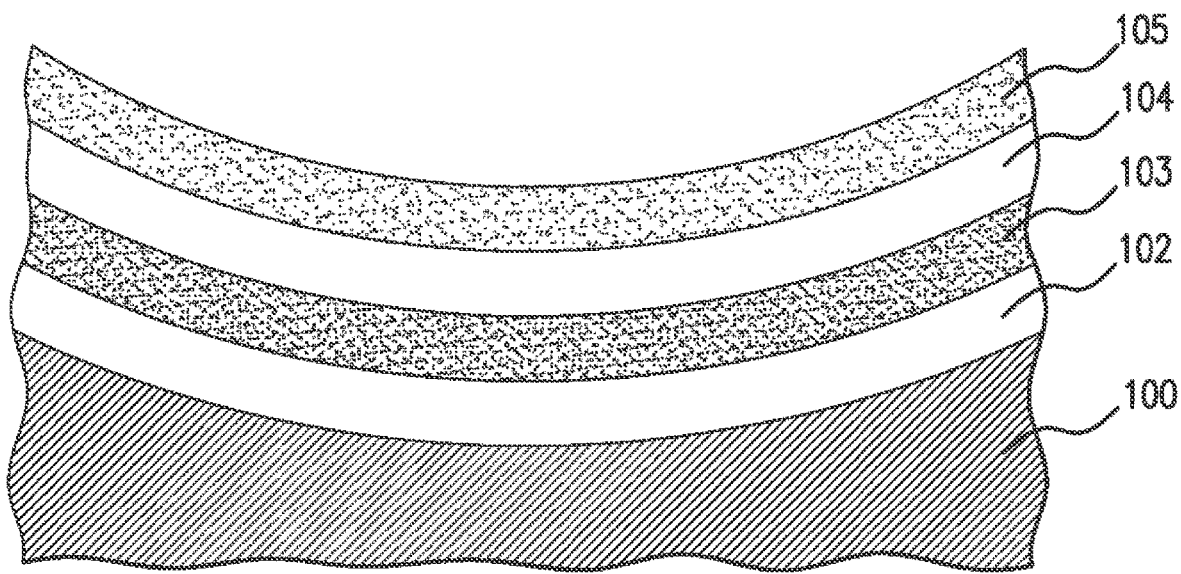
FIG. 5 is a cross-sectional view of the assembly of FIG. 2 after the next process step.

FIG. 5 is a cross-sectional view of the assembly of FIG. 4 after the next process step of mounting an uncured supporting film 105 composed of a composite material directly on the pressure sensitive adhesive film 103, and co-curing the film 104 of composite material so that the array of interconnected solar cells is bonded to the supporting film.

Figure 6:
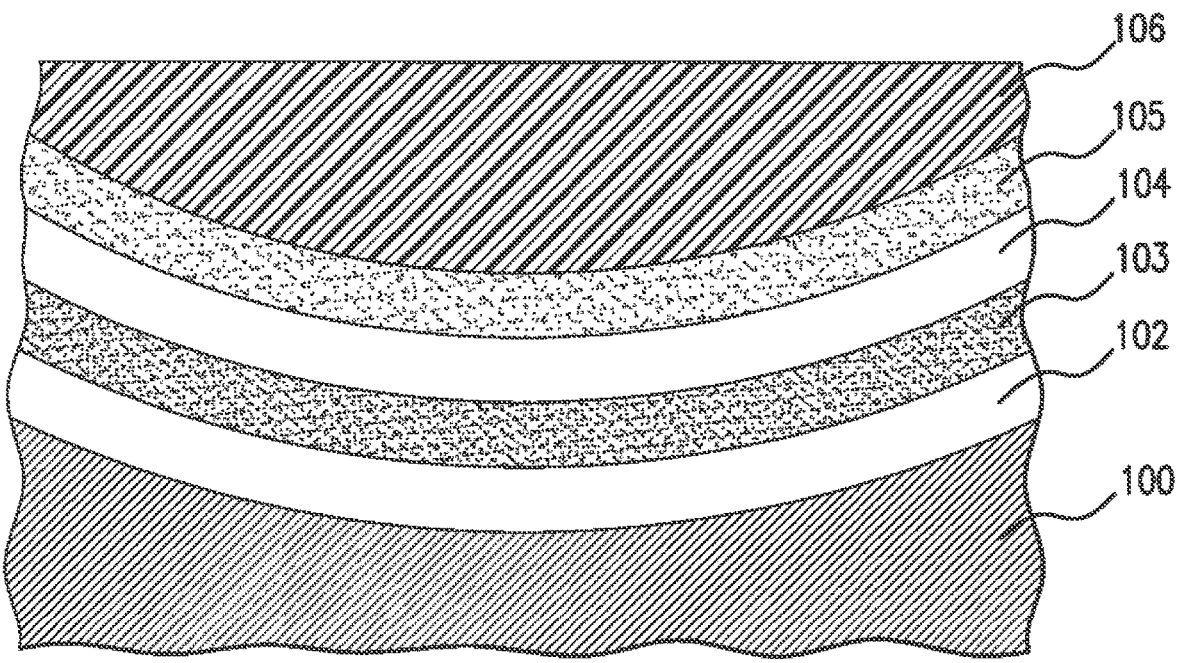
FIG. 6 is a cross-sectional view of the assembly of FIG. 2 after the next process step.

FIG. 6 is a cross-sectional view of the assembly of FIG. 2 after the next process step in which a support structure 106 is bonded to the supporting film 105. In one embodiment, the supporting structure is an airfoil.

Figure 7:
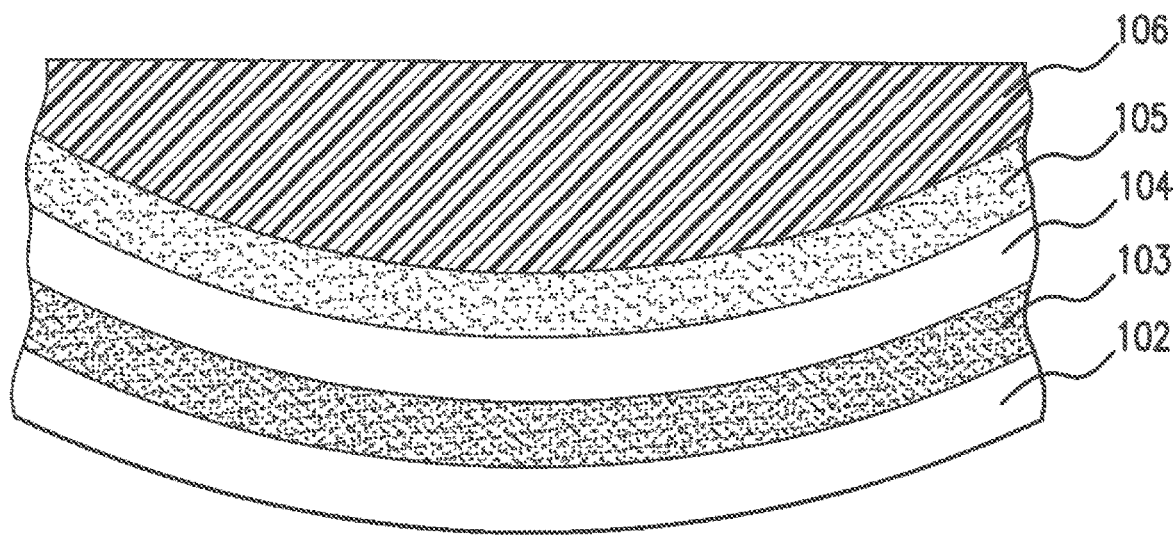
FIG. 7 is a cross-sectional view of a solar cell assembly or airfoil structure as fabricated in FIG. 6 after removal from the fixture.

FIG. 7 is a cross-sectional view of a solar cell assembly or airfoil structure 106 as fabricated in FIG. 6 after removal from the fixture 100.

Figure 8:
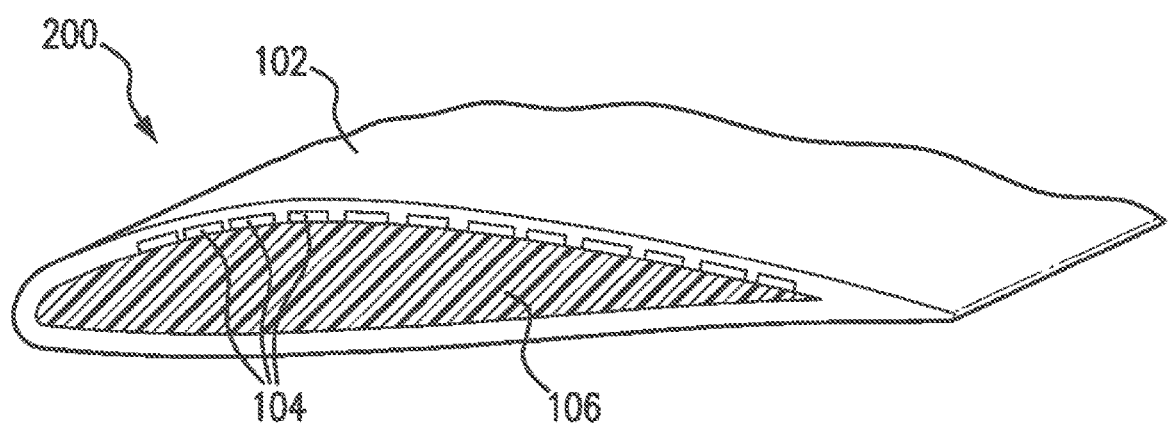
FIG. 8 is a perspective view of an airfoil of FIG. 7.

FIG. 8 is a perspective view of an airfoil 200 with individual solar cells 104 mounted on the top surface thereof, with the top surface being formed by the EFTE film 102.

In addition to an airfoil, the present technique may be used to fabricate solar cells on the non-planar surface of a variety of different vehicles or other structures (e.g., building materials).

Exemplary aircraft having non-planar surfaces include aerostats (which are lighter than air), and aerodynes (which are heavier than air). Exemplary aerostats can include, for example, unpowered vessels (e.g., balloons such as hot air balloons, helium balloons, and hydrogen balloons) and powered vessels (e.g., airships or dirigibles). Exemplary aerodynes can include, for example, unpowered vessels (e.g., kites and gliders) and powered vessels (e.g., airplanes and helicopters). Exemplary aerodynes can be fixed wing vessels (e.g., airplanes and gliders) or rotorcraft (e.g., helicopters and autogyros).

Exemplary watercraft having non-planar surfaces can be motorized or non-motorized, and can be propelled or tethered. Exemplary watercraft can include surface vessels (e.g., ships, boats, and hovercraft) and submersible vessels (e.g., submarines and underwater flotation vessels).

Exemplary land vehicles having non-planar surfaces can be motorized (e.g., automobiles, trucks, buses, motorcycles, rovers, and trains) or non-motorized (e.g., bicycles).

Figure 9:
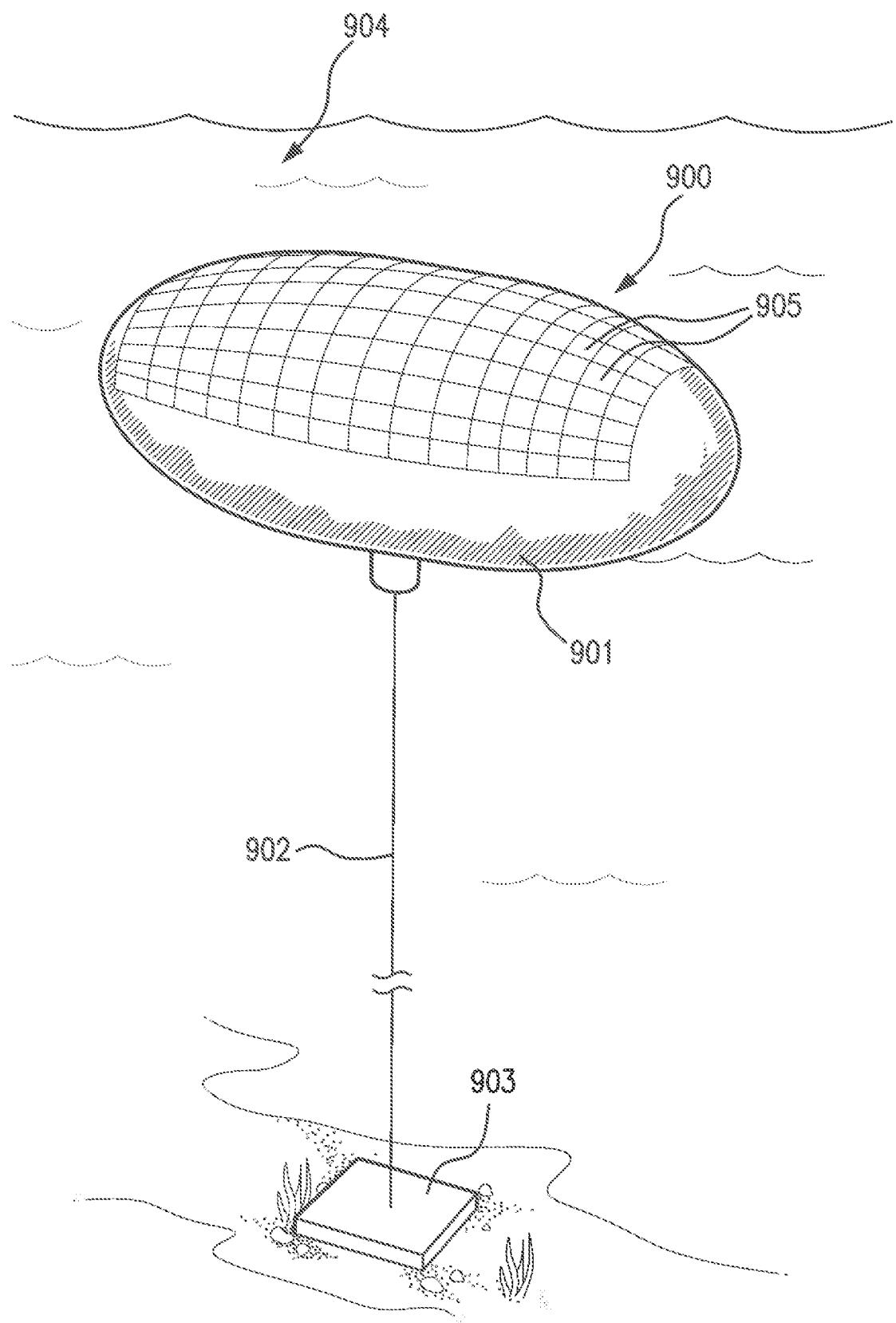
FIG. 9 is a perspective view of an exemplary embodiment of a watercraft having a solar assembly, according to the present disclosure, attached to a non-planar surface of the watercraft.

FIG. 9 is a perspective view of an exemplary embodiment of a watercraft. A submersible watercraft 904 has a non-planar surface and is attached to platform 903 via tether 902. Submersible watercraft 904 includes the underwater flotation vessel 901 that is held at a desired depth below the water surface by controlling the length of the tether 902. The solar cell assembly 900 is attached to a non-planar surface of the underwater flotation vessel 901. In certain embodiments, when light impinges on the solar cell assembly 900 of submersible watercraft 904, electrical current generated from the solar cell assembly 900 can be provided to platform 903 via the tether 902.

Figure 10:
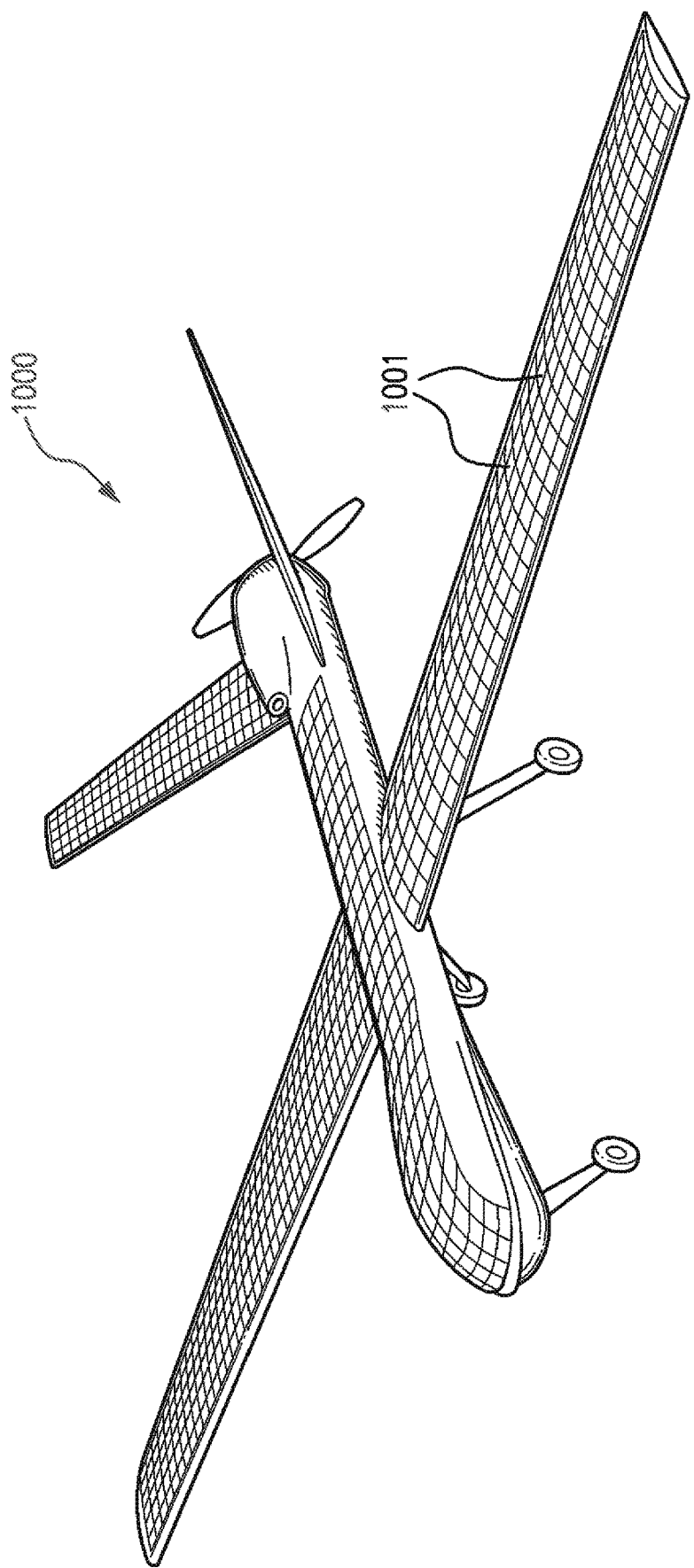
FIG. 10 is a perspective view of an exemplary embodiment of an aircraft having a solar assembly, according to the present disclosure, attached to different, non-planar surfaces of the aircraft.

FIG. 10 is a perspective view of an exemplary embodiment of an unmanned aircraft. Aircraft 1000 has a non-planar surface and is a fixed wing vessel. The solar cell assembly 1001 is attached to a non-planar surface of the wing of the aircraft 1000. In certain embodiments, when light impinges on the solar cell assembly 1001 of aircraft 1000, electrical current generated from the solar cell assembly 1001 can be provided for operation of systems (e.g., navigational systems, propulsion systems, and the like) of aircraft 1000.

Figure 11:
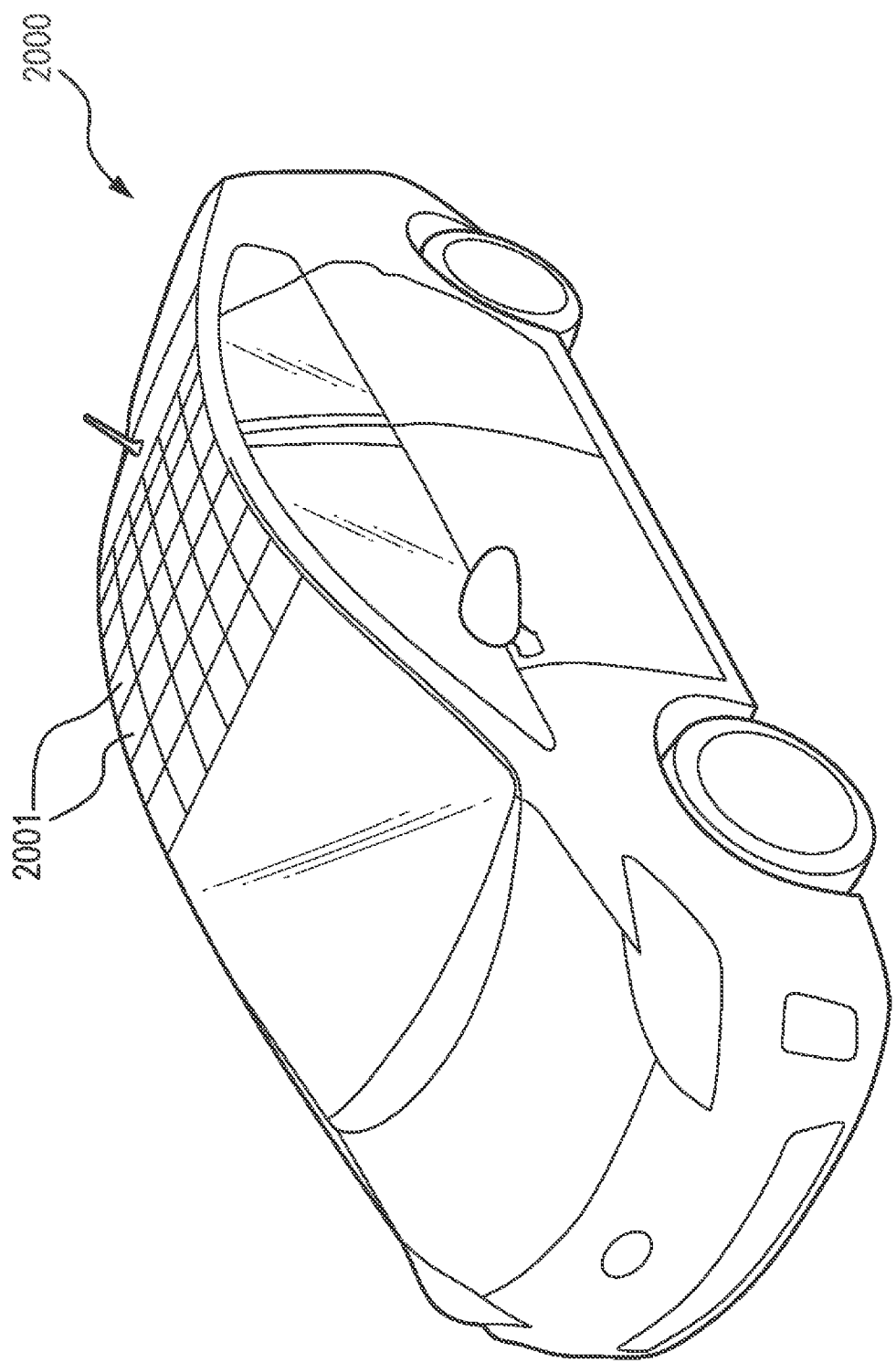
FIGS. 11 and 12 are perspective views of exemplary embodiments of land vehicles having solar assemblies, according to the present disclosure, attached to surfaces of the land vehicles.

FIG. 11 is a perspective view of an exemplary embodiment of a land vehicle. Land vehicle 2000 has a non-planar surface and is an automobile. The solar cell assembly 2001 is attached to a non-planar surface of an automobile 2000. In certain embodiments, when light impinges on the solar cell assembly 2001 of automobile 2000, electrical current generated from solar cell assembly 2001 can be provided for operation systems (e.g., navigational systems, propulsion systems, and the like) of automobile 2000. In certain embodiments, automobile 2000 is a hybrid or electric powered automobile.

Figure 12:
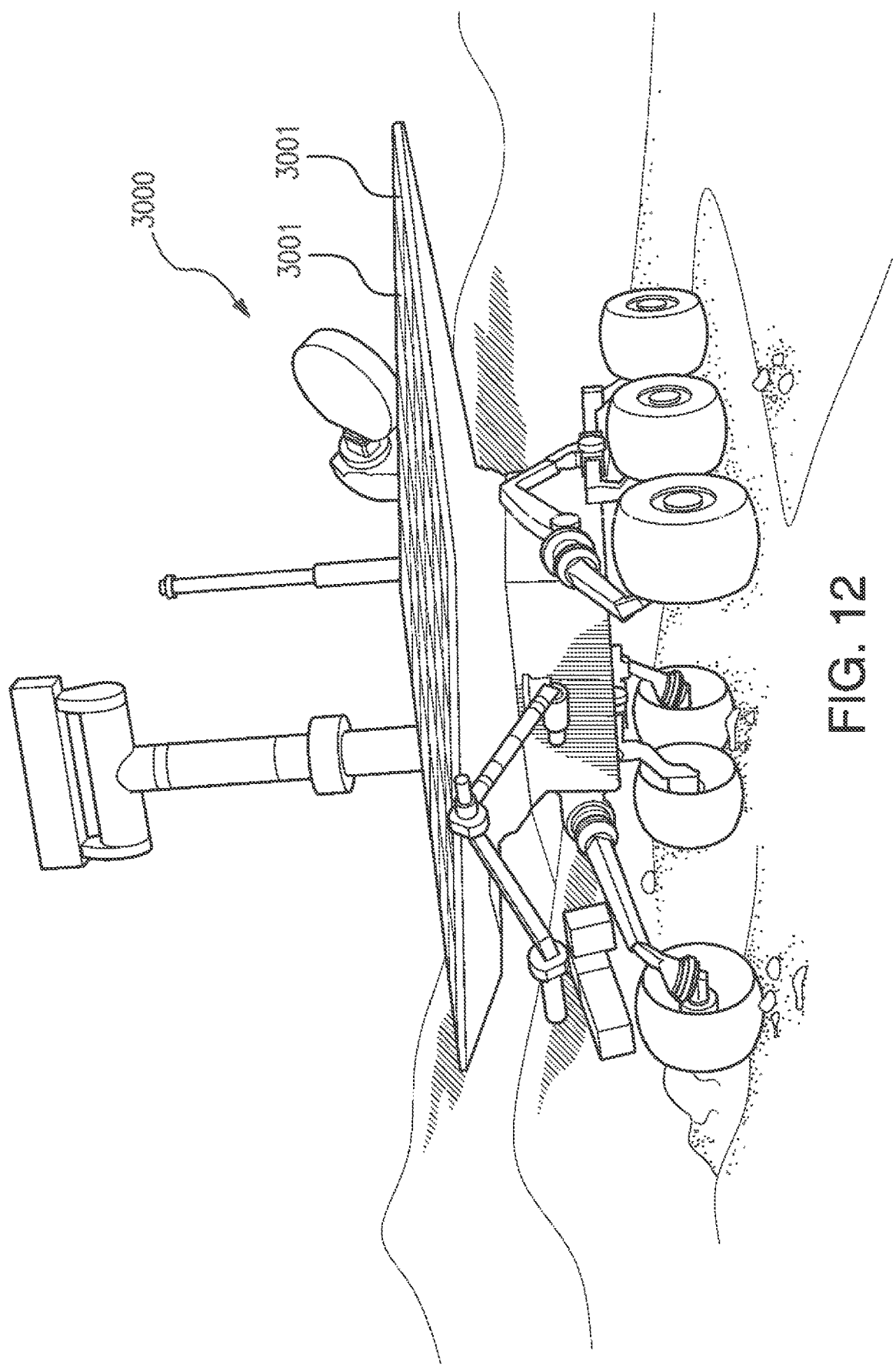

FIG. 12 is a perspective view of another exemplary embodiment of a land vehicle. Land vehicle 3000 has a non-planar surface and is a rover that can be used for land navigation and/or exploration on earth or other planets. The solar cell assembly 3001 is attached to a non-planar surface of the rover 3000. In certain embodiments, when light impinges on the solar cell assembly 3001 of rover 3000, electrical current generated from solar cell assembly 3001 can be provided for operation of systems (e.g., navigational systems, propulsion systems, and the like) of rover 3000. In certain embodiments, rover 3000 is a hybrid or electric powered land vehicle.

Although this disclosure has been described in certain specific embodiments, many additional modifications and variations would be apparent to those skilled in the art. The present disclosure is therefore considered in all respects to be illustrative and not restrictive. The scope of the disclosure is indicated by the appended claims, and all changes that come within the meaning and range of equivalents thereof are intended to be embraced therein.

It will be understood that each of the elements described above, or two or more together, also may find a useful application in other types of constructions differing from the types described above.

It is to be noted that the terms "front", "back", "top", "bottom", "over", "on", "under", and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

The present disclosure can be embodied in various ways. The above described orders of the steps for the methods are only intended to be illustrative, and the steps of the methods of the present disclosure are not limited to the above specifically described orders unless otherwise specifically stated. Note that the embodiments of the present disclosure can be freely combined with each other without departing from the spirit and scope of the disclosure.

Although some specific embodiments of the present disclosure have been demonstrated in detail with examples, it should be understood by a person skilled in the art that the above examples are only intended to be illustrative but not to limit the scope of the present disclosure. It should be understood that the above embodiments can be modified without departing from the scope and spirit of the present disclosure which are to be defined by the attached claims.

The invention claimed is:

1. A method of fabricating a solar cell array carrier in an assembly fixture comprising:
    providing a composite face sheet on the surface of the assembly fixture;
    providing a double sided adhesive film and positioning it on the top surface of the face sheet;
    bonding the bottom surface of the adhesive film to the to the top surface of the face sheet by co-curing;
    positioning an array of solar cell assemblies over the top surface of the adhesive film;
    bonding each of the array of solar cell assemblies to a predefined region on the top surface of the face sheet; and
    removing the carrier with the array of solar cell assemblies from the assembly fixture.

2. A method as defined in claim 1, wherein the composite face sheet includes a poly (4, 4'-oxydiphenylene-pyromellitimide) material.

3. A method as defined in claim 2, further comprising bonding a foam supporting structure to the composite face sheet.

4. A method as defined in claim 1, wherein the solar cell assemblies are electrically connected III-V compound semiconductor multijunction solar cells.

5. A method as defined in claim 1, wherein the assembly fixture has a concave surface with a surface roughness of less than 0.001 inches rms.

6. A method as defined in claim 1, wherein the concave surface of the assembly fixture forms an airfoil shaped surface.

7. A method as defined in claim 1, wherein the adhesive film is a single monomer or co-monomer blend.

8. A method as defined in claim 1, wherein the surface of the assembly fixture is in the shape of an airfoil skin.

9. A method of fabricating a solar cell array carrier in an assembly fixture comprising:
    providing a carbon fiber composite face sheet;
    providing a double sided adhesive film having a top surface and a bottom surface and positioning the bottom surface thereof on the top surface of the face sheet;
    bonding the bottom surface of the adhesive film to the to the top surface of the face sheet by co-curing;
    positioning a plurality of strings of solar cell assemblies over the top surface of the adhesive film; and
    sequentially bonding each of the strings of solar cell assemblies to predefined regions on the top surface of the face sheet.

* * * * *